(12) United States Patent
Hung et al.

(10) Patent No.: US 9,847,339 B2
(45) Date of Patent: Dec. 19, 2017

(54) SELF-ALIGNED MULTIPLE PATTERNING SEMICONDUCTOR DEVICE FABRICATION

(71) Applicant: Macronix International Co., Ltd., Hsin-chu (TW)

(72) Inventors: Yu-Min Hung, Taichung (TW); Chien-Ying Lee, New Taipei (TW); Tzung-Ting Han, Hsinchu (TW)

(73) Assignee: Macronix International Co., Ltd., Hsin-chu (TW)

( * ) Notice: Subject to any disclaimer, the term of this patent is extended or adjusted under 35 U.S.C. 154(b) by 0 days.

(21) Appl. No.: 15/096,560

(22) Filed: Apr. 12, 2016

(65) Prior Publication Data
US 2017/0294442 A1    Oct. 12, 2017

(51) Int. Cl.
| H01L 21/768 | (2006.01) |
| H01L 27/11521 | (2017.01) |
| H01L 23/528 | (2006.01) |
| H01L 29/788 | (2006.01) |
| H01L 21/311 | (2006.01) |
| H01L 21/3213 | (2006.01) |

(52) U.S. Cl.
CPC ... *H01L 27/11521* (2013.01); *H01L 21/31111* (2013.01); *H01L 21/32133* (2013.01); *H01L 21/76892* (2013.01); *H01L 21/76895* (2013.01); *H01L 23/528* (2013.01); *H01L 29/7883* (2013.01)

(58) Field of Classification Search
None
See application file for complete search history.

(56) References Cited

U.S. PATENT DOCUMENTS

| 6,495,870 B1 * | 12/2002 | Sekiguchi | G03F 1/36 257/203 |
| 7,084,440 B2 * | 8/2006 | Sel | H01L 27/0207 257/208 |
| 8,399,347 B2 * | 3/2013 | Lindsay | H01L 23/4824 257/773 |
| 9,093,280 B2 * | 7/2015 | Sato | H01L 27/11519 |
| 9,153,535 B1 * | 10/2015 | Wu | H01L 21/0337 |
| 2008/0017996 A1 * | 1/2008 | Sato | H01L 21/32139 257/784 |
| 2009/0154240 A1 * | 6/2009 | Park | G11C 5/063 365/185.05 |
| 2009/0221147 A1 * | 9/2009 | Kikutani | H01L 21/0337 438/694 |

(Continued)

*Primary Examiner* — Reema Patel
*Assistant Examiner* — Steven Christopher
(74) *Attorney, Agent, or Firm* — Alston & Bird LLP

(57) ABSTRACT

Various embodiments provide a self-merged profile (SMP) method for fabricating a semiconductor device and a device fabricated using an SMP method. In an example embodiment, a semiconductor device is provided. The example semiconductor device comprises (a) a plurality of conductive lines; (b) a plurality of conductive pads; (c) a plurality of dummy tails; and (d) a plurality of closed loops. Each of the plurality of conductive pads is associated with one of the plurality of conductive lines, one of the plurality of dummy tails, and one of the plurality of closed loops. In example embodiments, the plurality of dummy tails and the plurality of closed loops are formed as residuals of the process used to create the plurality of conductive lines and the plurality of conductive pads.

6 Claims, 16 Drawing Sheets

(56) References Cited

U.S. PATENT DOCUMENTS

| | | | |
|---|---|---|---|
| 2010/0038795 A1* | 2/2010 | Aburada | H01L 21/0337 257/773 |
| 2010/0155959 A1* | 6/2010 | Park | H01L 21/0337 257/773 |
| 2010/0244269 A1* | 9/2010 | Kim | H01L 21/0337 257/773 |
| 2011/0117745 A1* | 5/2011 | Sato | H01L 21/0337 438/703 |
| 2013/0056878 A1* | 3/2013 | Kim | H01L 21/76838 257/774 |
| 2013/0237050 A1 | 9/2013 | Kikutani | |
| 2015/0325478 A1 | 11/2015 | Seong et al. | |
| 2016/0020216 A1 | 1/2016 | Lin et al. | |
| 2016/0071792 A1* | 3/2016 | Nagashima | H01L 21/3085 257/773 |

* cited by examiner

SELF-ALIGNED MULTIPLE PATTERNING SEMICONDUCTOR DEVICE FABRICATION

TECHNOLOGICAL FIELD

Example embodiments of the present invention relate generally to semiconductor devices and, more particularly, to the fabrication of semiconductor devices using a reduced number of masks.

BACKGROUND

Advancements in the miniaturization of semiconductor devices continue to emphasize the importance of structural integrities of semiconductor devices. Similarly, advancements in the manufacture of semiconductor devices continue to emphasize the importance of efficiencies of the rate and cost of fabrication, particularly with increasing complexities of manufacturing smaller and smaller semiconductor devices. Manufacturers desire high yield, minimized costs, and reliable semiconductor devices.

In semiconductors, such as non-volatile memory devices, word lines are used to apply a voltage to a memory cell to program, erase, or otherwise activate the memory cell. Generally, each word line terminates on a word line pad. The word line pad may provide a connection to word line driver used to apply a voltage to the word line. In order to control the memory cells efficiently and reliably, it is important that each word line connect to a single pad and that each pad connect to a single word line. Therefore, when fabricating a chip, sufficient space must be allotted for the placement of word line pads and connecting a single word line to each word line pad.

Accordingly, there remains a need in the art for improved methods to efficiently fabricate semiconductor devices.

BRIEF SUMMARY

Various embodiments of the present invention provide semiconductor devices and methods for fabrication thereof. In particular, example embodiments of the present invention provide non-volatile memory devices with word line arrays fabricated using a self-merging profile (SMP) self-aligned multiple patterning method. For example, some embodiments of the present invention provide non-volatile memory devices with word line arrays fabricated using a SMP mask self-aligned quadruple patterning (SAQP) method. In example embodiments, the SMP self-aligned multiple patterning method requires the use of fewer masks than the traditional SAQP method for fabricating a word line head region of a non-volatile memory device. In example embodiments, the SMP SAQP method uses at most three masks to fabricate a word line head region of a non-volatile memory device.

According to one aspect of the present invention, a semiconductor device is provided. In an example embodiment, the semiconductor device comprises (a) a plurality of conductive lines; (b) a plurality of conductive pads; (c) a plurality of dummy tails; and (d) a plurality of closed loops. Each of the plurality of conductive pads is associated with one of the plurality of conductive lines, one of the plurality of dummy tails, and one of the plurality of closed loops.

According to another aspect of the present invention, a method for fabricating a semiconductor device is provided. In an example embodiment, the method comprises providing a chip blank comprising (a) a substrate, (b) a film stack, (c) a second core, and (d) a first core. The second core is between the first core and the film stack. The film stack is between the second core and the substrate. The method further comprises defining a first array into the first core; and defining a first set of spacers on the second core and based on the first array. The first set of spacers comprises a first spacer and an adjacent second spacer. The method further comprises etching a second array into the second core based on the first set of spacers. The portion of the second array formed by etching the second core about the first and second spacer results in a double array element in the second array.

In another example embodiment, a method of fabricating a semiconductor device is provided. The method comprises forming a plurality of conductive lines, a plurality of conductive pads, a plurality of dummy tails, and a plurality of closed loops by a self-aligning multiple patterning method comprising no more than three masks.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIGS. 4A, 5A, 6A, 7A, 8A, 10A, 11A, 12A, 13A, 14A, 15, and 16 illustrate partial top views of a non-volatile memory device at various steps in a SMP SAQP method, in accordance with an embodiment of the present invention;

FIGS. 4B, 5B, 6B, 7B, 8B, 9A, 9B, 9C, 10B, 11B, 12B, 13B, 14B, 17A, 17B, 17C, and 17D illustrate various cross-section views of a non-volatile memory device at various steps in a SMP SAQP method, in accordance with an embodiment of the present invention; and FIGS. 4C, 5C, 6C, 7C, 8C, 10C, 11C, 12C, and 13C illustrate an expanded top view of the top view shown in FIGS. 4A, 5A, 6A, 7A, 8A, 10A, 11A, 12A, and 13A, respectively, in accordance with an embodiment of the present invention.

DETAILED DESCRIPTION OF VARIOUS EMBODIMENTS

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Various embodiments of the present invention provide semiconductor devices having a conductive line array and a periphery region fabricated using a SMP self-aligned multiple patterning method. In various embodiments, the periphery region may comprise a plurality of conductive pads such that each conductive line is in direct electrical communication with a conductive pad. In example embodiments, the semiconductor device may be a non-volatile memory device. For example, the semiconductor device may be a NAND flash device, a NOR flash device, a programmable logic device (PLD), and/or the like. For example, the conductive line array may be a word line array and the periphery region may be a word line head region. Example embodiments of a non-volatile memory semiconductor device manufactured using a SMP SAQP method to fabricate the word line array and word line head region will be described herein as an example of manufacturing a semiconductor device conductive line array and periphery region using a SMP self-aligned multiple patterning method.

Figure 1:
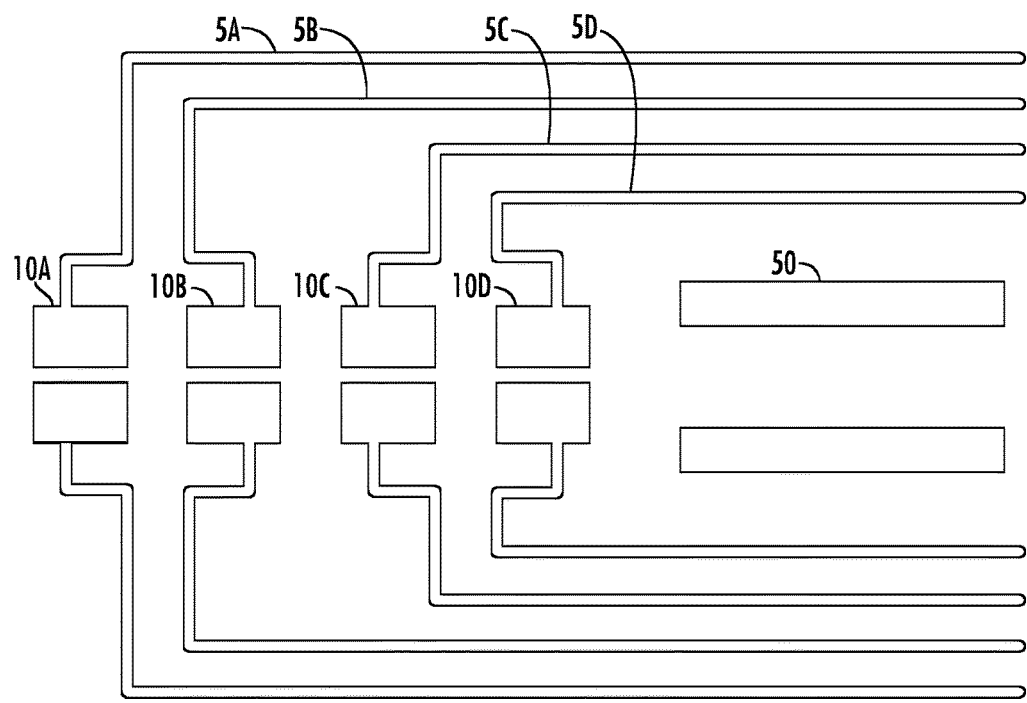
FIG. 1 illustrates the word line head region of a non-volatile memory device fabricated using a traditional SAQP method.

FIG. 1 illustrates the word line head region of a non-volatile memory device manufactured using the traditional SAQP method. In particular, the word line head region includes a plurality of word lines 5 (e.g., 5A, 5B, 5C, 5D) and corresponding word line pads 10 (e.g., 10A, 10B, 10C, 10D). The word line head region further comprises string selection lines and ground selection lines (SSL/GSL) 50, which are generally used to select a particular memory cell to be programmed, erased, read, and/or the like.

The traditional SAQP method for fabricating a word line region such as that illustrated in FIG. 1 comprises the use of four masks (e.g., photomasks). In particular, a first mask is used to define the word line array pattern (e.g., a poly line array (PLA) mask). A second mask is then used to enlarge the word line routing space such that there is sufficient space for the placement of the word line pads 10 (e.g., a poly line head (PLH) mask). A third mask is later used to define the word line pads 10 (e.g., a poly line pad (PLP) mask). Finally, a fourth mask is used to define a cut to ensure that each word line pad (e.g., 10A) is in direct electrical communication with only one word line (e.g., 5A) and is not in direct electrical communication with any other word lines. Herein, direct electrical communication is intended to mean that the two elements are placed in electrical communication with each other by a conductor. Thus, the traditional SAQP method requires the use of four masks to provide the word line head region illustrated in FIG. 1.

For example, a SAQP method comprises forming a first mask layer (e.g., using a PLA mask through photolithography processes) to a chip blank and then etching a first core of the chip blank to form a first array in the first core and then removing the first mask layer. A spacer is deposited along the edges of the first array and then the first array is removed. For example, spacer material is deposited on exposed portions of the chip blank and the first array and then etched to provide the spacers along the approximately vertical edges of the first array. A dry or wet strip may then be used to remove the remaining portion of the first array. A second mask layer (e.g., using a PLH mask through photolithography processes) is then formed on the chip blank to increase the distance between the resulting word lines such that there is enough space between the resulting word lines to place the word line pads. A second core may then be etched based on the spacers and the second mask layer to define a second array. The spacers and the second mask layer may then be removed. A second set of spacers may then be formed along the edges of the second array. Then the second array is removed. A third mask layer (e.g., using a PLP mask through photolithography processes) may be applied to the chip blank. Another etch is performed to form the word line array and word line pads on the chip blank by using the third mask layer and the spacers as the etching mask. The third mask and the spacers are then removed. A fourth mask layer (e.g., using a PLC mask through photolithography processes) is then formed on the chip blank to define a cut that ensures adjacent word line pads are not in direct electrical communication with one another. An etching process is performed by using the fourth mask layer to etch underlying materials to ensure adjacent word line pads are not in direct electrical communication with one another. The fourth mask layer is then removed.

Figure 2:
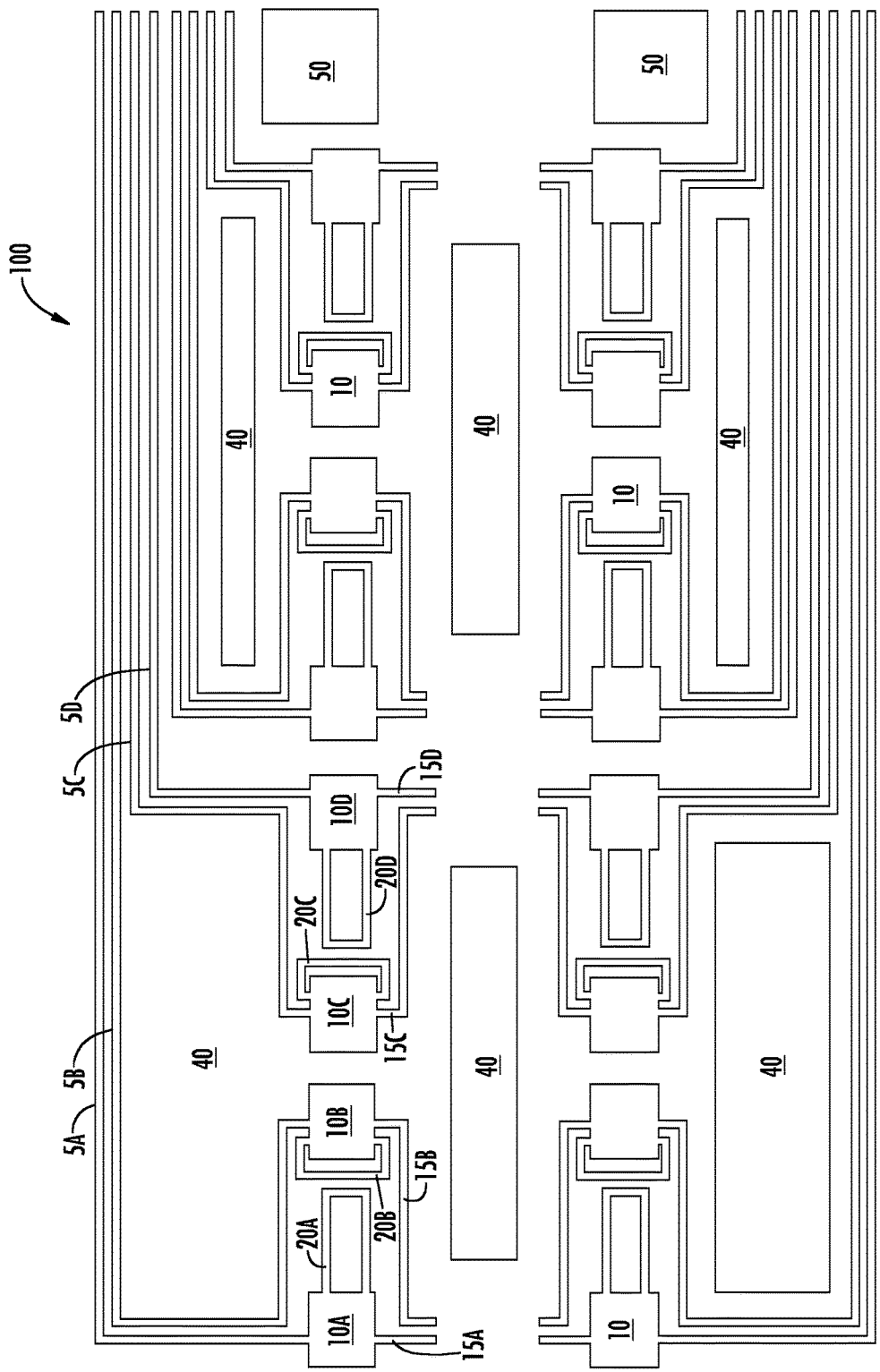
FIG. 2 illustrates the word line head region of a non-volatile memory device fabricated using a SMP SAQP method, in accordance with an embodiment of the present invention.

FIG. 2 illustrates an embodiment of a word line head region 100 of a non-volatile memory device fabricated using a SMP self-aligned multiple patterning method. In particular, the word line head region 100 was fabricated using a SMP SAQP method. The word line head region 100 comprises a plurality of word lines 5 (e.g., 5A, 5B, 5C, 5D) and corresponding word line pads 10 (e.g., 10A, 10B, 10C, 10D). As should be noted, in FIG. 1, two adjacent word lines (e.g., 5C and 5D) are parallel or anti-parallel to each other at all times. However, as shown in FIG. 2, two adjacent word lines (e.g., 5A and 5B) are parallel for a first portion of the length of the word lines, and perpendicular and/or not parallel to each other for a second portion of the length of the word lines. In example embodiments, at least some of the word lines of a word line head region 100 fabricated using the SMP SAQP method have more turns than some of the other word lines. For example, as shown in FIG. 2, word line 5B has extra turns compared to word line 5A. Each word line (e.g., 5A) is in direct electrical communication with exactly one word line pad (e.g., 10A). Each word line pad (e.g., 10A) is not in direct electrical communication with any other word line pad 10 (e.g., 10B). The word line head region 100 also comprises SSL/GSL 50.

Additionally, the word line head region 100 comprises a plurality of dummy lines 15 (e.g., 15A, 15B, 15C, 15D) and a plurality of closed loops 20 (e.g., 20A, 20B, 20C, 20D). Each dummy line (e.g., 15A) and each closed loop (e.g., 20A) corresponds to exactly one word line pad (e.g., 10A). The dummy lines 15 and closed loops 20 are residues of the reduced mask count SAQP process used to fabricate the word line head region 100. The word line head region 100 further comprises dummy blocks 40. The dummy blocks 40 may be configured to reduce damage experience by the word line pads 10 and SSL/GSL 50 during etching processes, for example. In some embodiments, a first closed loop (e.g., 20A) and an adjacent second closed loop (e.g., 20B) are located between corresponding word line pads (e.g., 10A and 10B).

As noted above, the word line head region of a non-volatile memory device is an example embodiment of the present invention. For example, in various embodiments, the word line head region 100 is an example of a periphery region in a semiconductor device. The plurality of word lines 5 (e.g., 5A, 5B, 5C, 5D) are an example of conductive lines in the semiconductor device for electrical connection. For example, in various embodiments, the conductive lines may not perform the function of word lines. The word line pads 10 (e.g., 10A, 10B, 10C, 10D) are examples of conductive pads in the semiconductor device for connecting the corresponding conductive lines and conductive vias landing on the conductive pads. Through conductive vias, electrical connections could be established between different conductive layers (e.g., metal layers).

In various embodiments, the word line head region 100 is fabricated by a SMP SAQP process using at most three masks. For example, a first mask may be used to define the word line array pattern (e.g., a poly line array (PLA) mask). A second mask may be used to define the word line pad pattern (e.g., a poly line pad (PLP) mask). A third mask may be used to define a word line end cut area such that the dummy lines 14 (see FIG. 14A) are cut to create the dummy tails 15. Thus, the SMP SAQP method for fabricating the word line head region 100 does not comprise a mask used to enlarge the word line routing space such that there is sufficient space for the placement of the word line pads 10 (e.g., a poly line head (PLH) mask). As such, the SMP SAQP method requires fewer masks than the traditional SAQP method for fabricating a word line head region.

Figure 3:
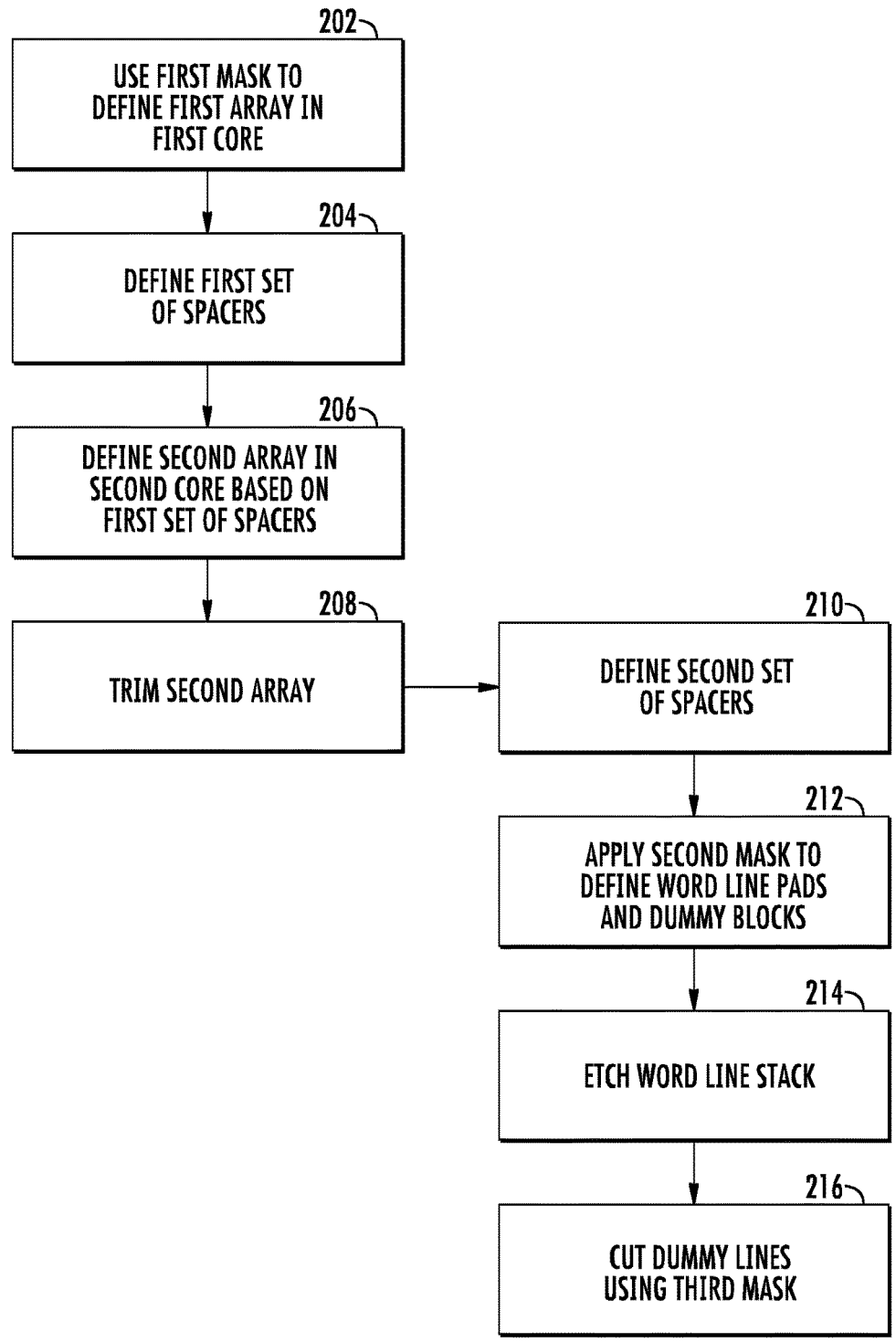
FIG. 3 shows a flowchart illustrating various process and procedures that may be completed in the fabrication of a non-volatile memory device using the SMP SAQP method, in accordance with an embodiment of the present invention.
Figure 4A:
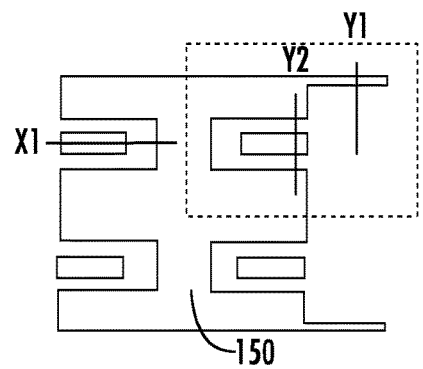
Figure 4B:
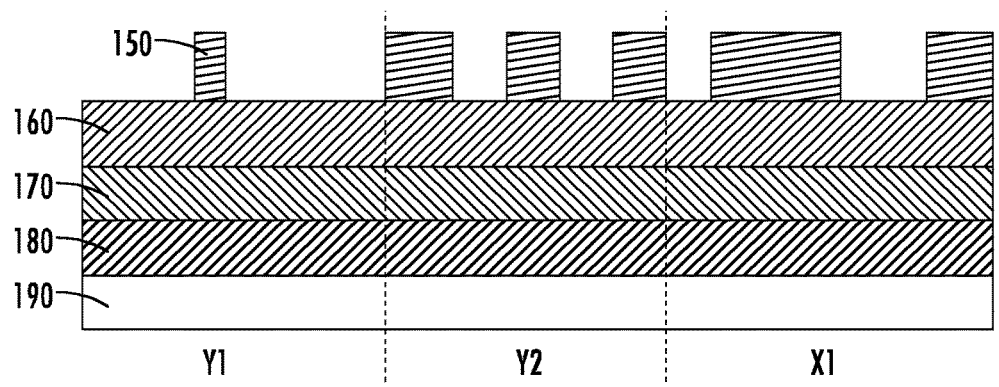

FIG. 3 provides a flowchart illustrating various processes and procedures that may be completed in the fabrication of a word line head region 100, in accordance with example embodiments of the present invention. To facilitate fabrication of the word line head region 100, a chip blank is provided. Various cross-sections of an example chip blank are shown in FIG. 4B. For example, the chip blank may comprise a substrate 190, a word line film stack 180, a second core 170, and a first core 160. The substrate 190 may be a silicon substrate and/or the like. For example, the substrate 190 may be a wafer. For example, the word line film stack 180 may comprise one or more hard masks (e.g., oxide layer) over a control gate layer, a floating gate layer underlying the control gate layer, an inter-dielectric layer between the floating gate layer and the control gate layer, or a tunnel dielectric layer (e.g., oxide layer) under the floating gate layer. In various embodiments, the word line film stack may be composed of poly silicon, oxide, silicon, and/or other materials used to make the device. The first core 160, the second core 170, or both cores may comprise at least one of poly silicon, advanced patterning film, oxide, silicon nitride, or silicon.

Figure 4C:
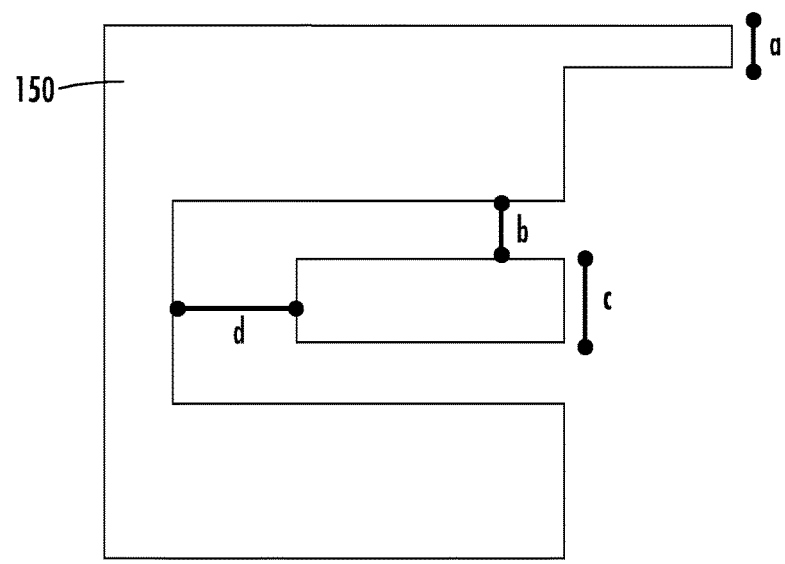

Starting at step 202 in FIG. 3, a first mask is used to define a first array 165 in the first core 160. For example a first mask 150 may be applied to the chip blank. For example, a layer of photoresist material may be formed on the chip blank and prebaked to drive off excess photoresist solvent. The photoresist layer is then exposed to a pattern of bright light that will allow exposed areas of the photoresist layer to be removed and thereby forming the first mask 150. For example, photoresist mask may be deposited on the first core 160, as shown in FIGS. 4A, 4B, and 4C. The lines Y1, Y2, and X1 shown in FIG. 4A show the portions of the chip blank that correspond to the Y1, Y2, and X1 cross-sections shown in FIG. 4B. The boxed region of FIG. 4A shows the portion of the chip blank shown in the blown up top view of FIG. 4C. The mask may define the features of the first array 165 (shown in FIGS. 5A, 5B, and 5C). A wet or dry etching process may then be used to remove portions of the first core 160 that are not protected by the first mask 150. The first mask 150 is then removed. For example, the remaining portions of the photoresist layer may be stripped or ashed such that the first mask 150 is removed and the first array 165 is exposed. Thus, the first core 160 may be patterned to form a first array 165 therefrom.

Figure 5A:
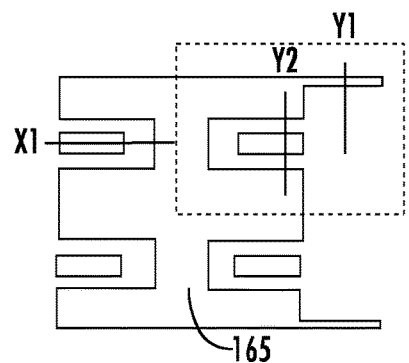
Figure 5B:
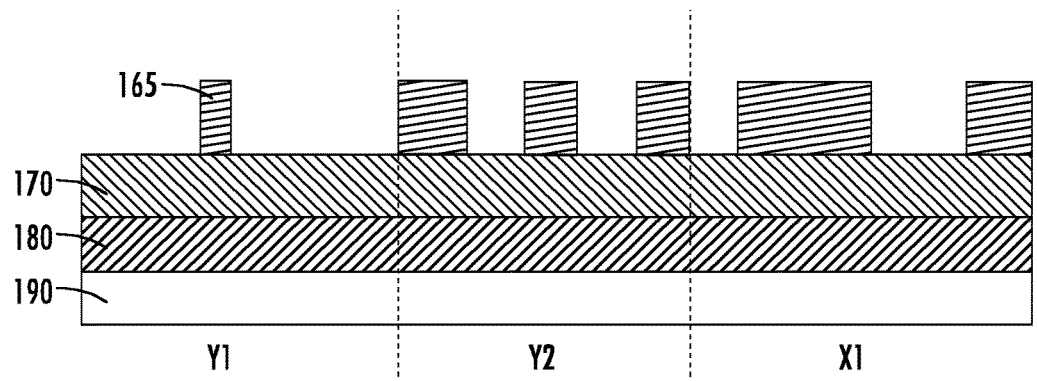
Figure 5C:
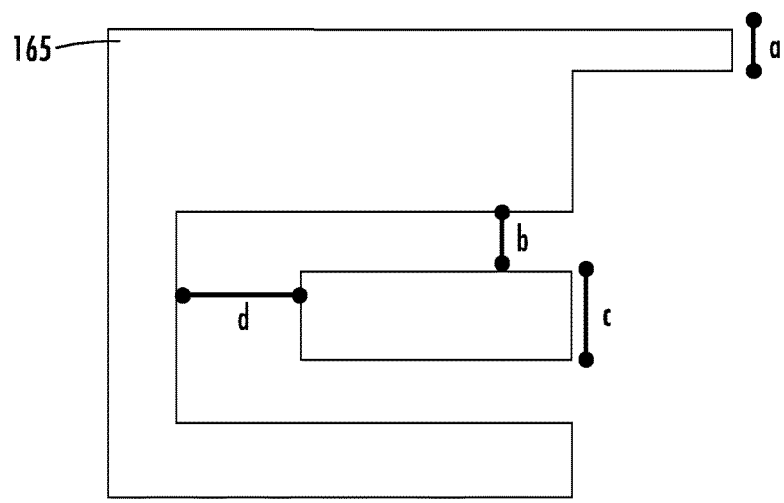

FIGS. 5A, 5B, and 5C show top views and various cross-sections of the chip blank once the first mask 150 has been removed from the first array 165. In example embodiments, the distance a is 30-50 nm, the distance b is 50-100 nm, the distance c is greater than 50 nm, and the distance d is greater than 150 nm.

Figure 6A:
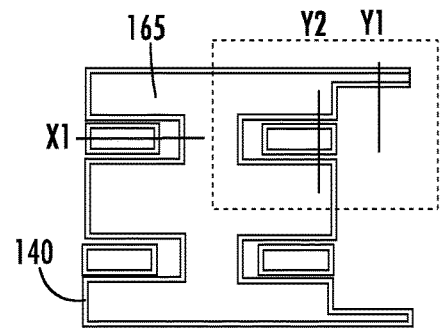
Figure 6B:
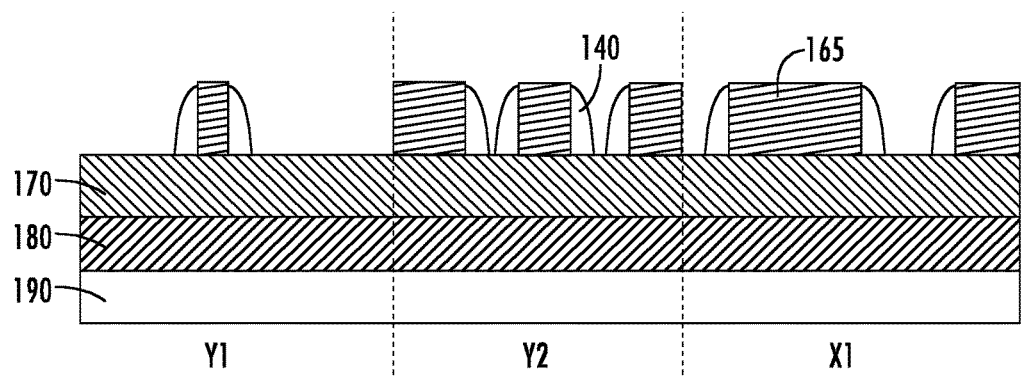
Figure 6C:
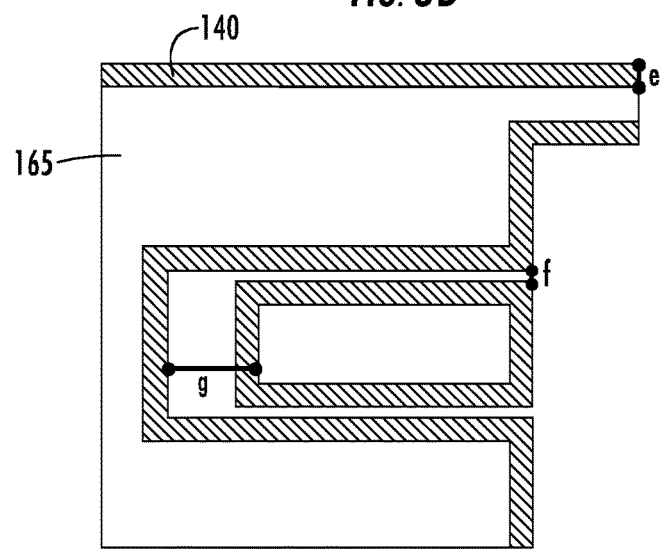
Figure 7A:
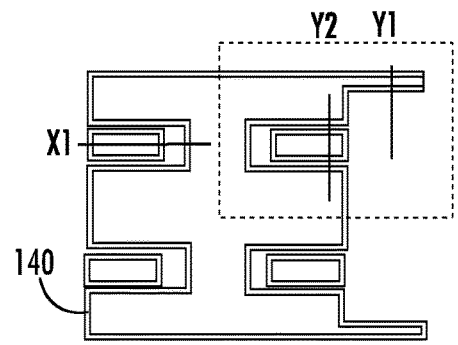
Figure 7B:
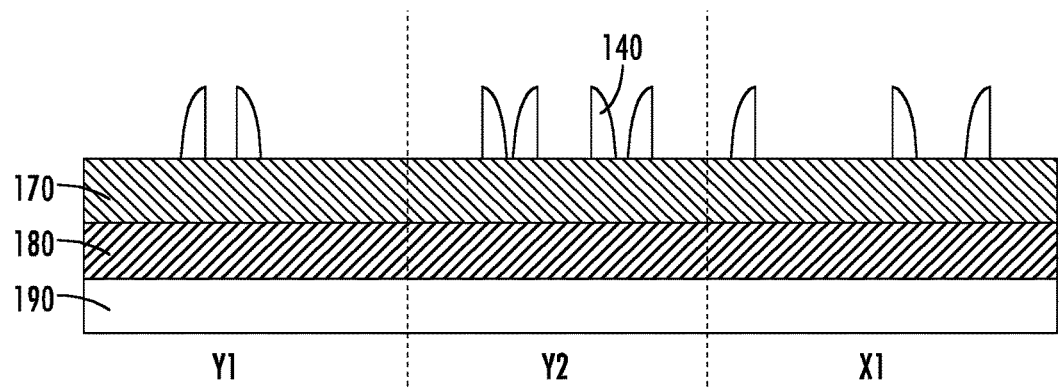
Figure 7C:
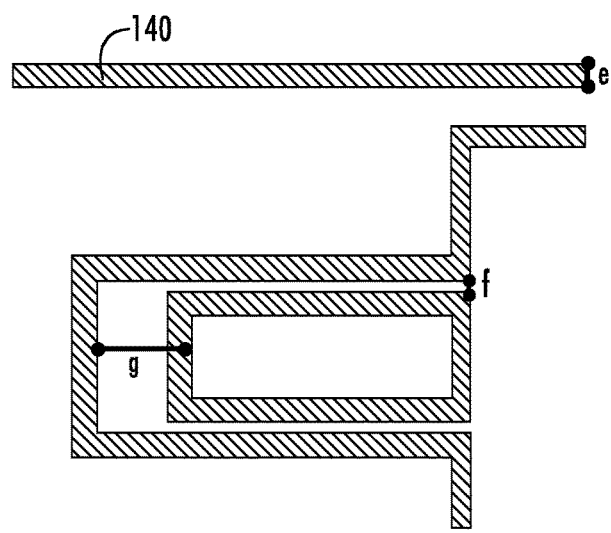

Returning to FIG. 3, a first set of spacers 140 is defined at step 204. For example, the first set of spacers 140 may be defined based on the first array 165. For example, spacer material such as an oxide, low temperature oxide (LTO), silicon, silicon nitride, and/or the like, may be deposited onto the chip blank. For example, a layer of spacer material may be deposited onto the exposed surface of the second core 170 and the sidewalls and exposed surface of the first array 165. The spacer material may then be etched to remove the spacer material from the horizontal surfaces such that a first set of spacers (140) is formed on the second core (170) and on sidewalls of the patterned first core 160 of the first array (165). FIGS. 6A, 6B, and 6C illustrate example top views and cross-sections of the chip blank after the spacer material has been deposited on the exposed second core 170 and the first array 165 and etched to provide the spacers 140. A dry or wet strip may then be used to remove the remaining portion of the first array 165. FIGS. 7A, 7B, and 7C illustrate top views and cross-sections illustrating the first set of spacers 140 after the first array 165 has been stripped. In example embodiments, the width of one of the spacers, as shown by dimension e may be 20-40 nm, the width of the space indicated by dimension f may be less than 20 nm, and dimension g may be greater than 30 nm.

Figure 8A:
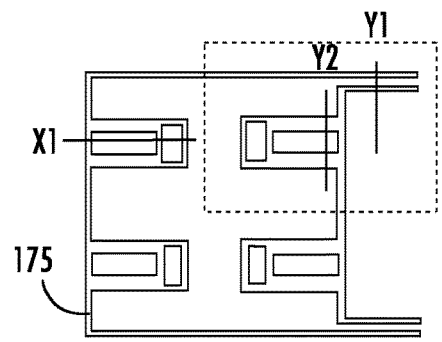
Figure 8B:
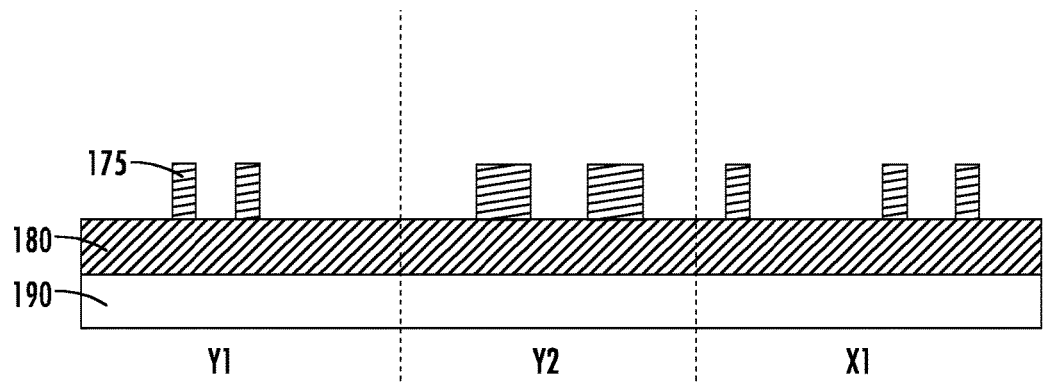
Figure 8C:
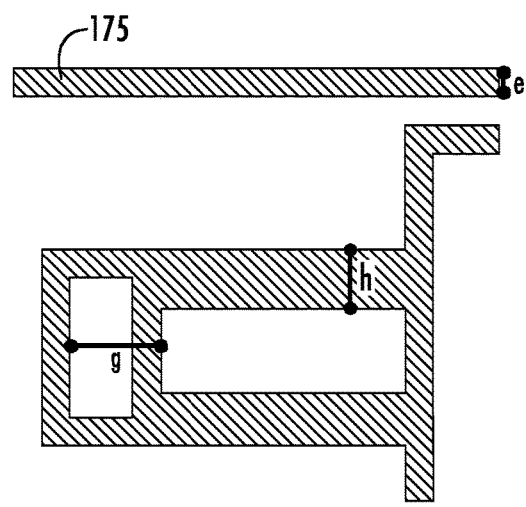

Continuing with FIG. 3, at step 206, a second array 175 is defined in the second core 170 based on the first set of spacers 140. For example, a dry or wet etch may be performed to remove the portion of the second core 170 that is not protected by the first set of spacers 140. The first set of spacers 140 may then be removed. For example, a hard mask removal process may be used to remove the first set of spacers 140. FIGS. 8A, 8B, and 8C show the second array 175 after the removal of the first set of spacers 140. In example embodiments, the dimension h may be 50-100 nm.

Figure 9A:
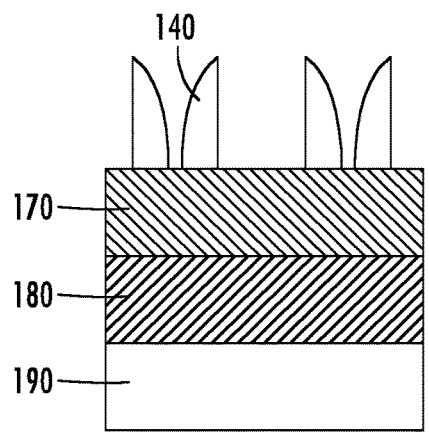
Figure 9B:
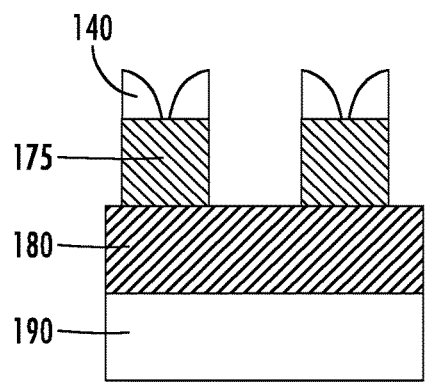
Figure 9C:
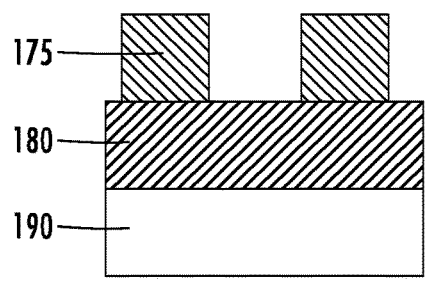

As should be noted, the second array 175 comprises fewer elements than the first set of spacers 140. In particular, the spacers 140 that were separated by dimension f (e.g., less than 20 nm) have defined a single element of the second array. FIGS. 9A, 9B, and 9C provide a cross-section of three different points in the process of defining the second array 175. At the beginning of the process, shown in FIG. 9A, two spacers of the first set of spacers 140 are separated by less than 20 nm. When the etch occurs, the portion of the second core 170 located between the two spacers is left in intact and not removed, as shown in FIG. 9B. In general, the method of using a self-merged profile (SMP) need not be limited to situations in which there are less than 20 nm between adjacent spacers. Rather, the SMP method is applicable for any spacing of adjacent spacers such that the etching gases does not penetrate through the space between the adjacent spacers. Hence, the second core 170 located between the two spacers is left in intact during the etch. A self-merged profile (SMP) method are referred to FIGS. 9A and 9B, and related descriptions of these two figures. FIG. 9C shows a portion of the second array 175 including two double array elements. A double array element is an array element formed by a self-merged profile (SMP) wherein two or more spacers define one array element. For example, a double array element may be formed in the second array 175 by etching the second core 170. In the illustrated embodiment, each double array element was defined by two spacers 140 that were separated by less than 20 nm. Moreover, a double array element may be wider than a single array element defined by a single spacer. For example, in an example embodiment, a single array element may have a width of 20-40 nm (e.g., dimension e) and a double array element may have a width of 50-100 nm (e.g., dimension h).

Figure 10A:
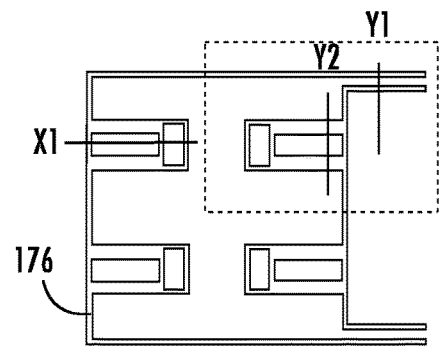
Figure 10B:
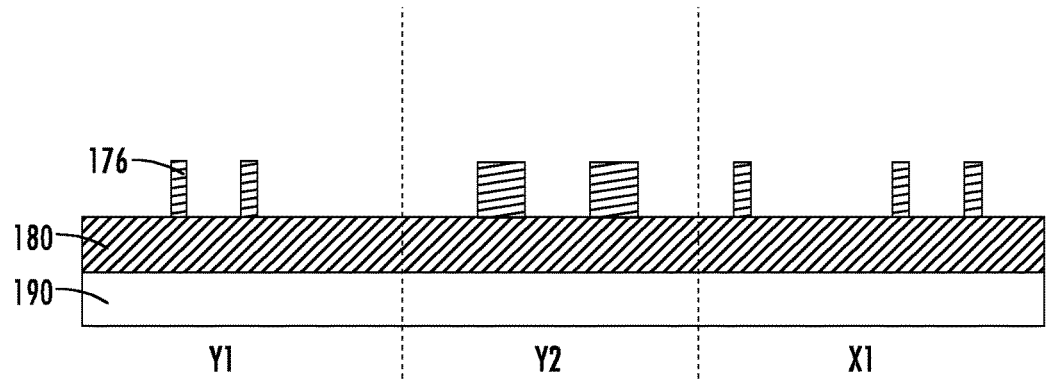
Figure 10C:
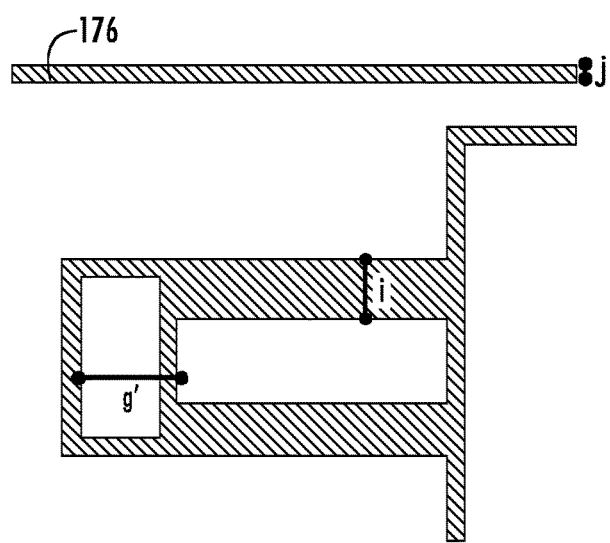

Continuing with FIG. 3, at step 208, the second array 175 may be trimmed. For example, an etch or other trim process may be performed to trim the second array 175 to appropriate critical dimensions (CD). In particular, the second array 175 may be trimmed to provide the appropriate spacing between adjacent word lines. FIGS. 10A, 10B, and 10C illustrate top views and cross-sections of the trimmed second array 176. In example embodiments, the dimension j may be 10-20 nm and the dimension i may be 40-80 nm. In example embodiments, the dimension g' may be greater than 30 nm.

Figure 11A:
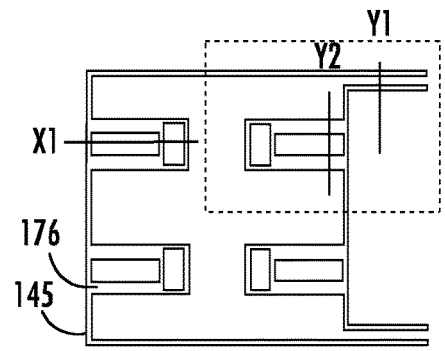
Figure 11B:
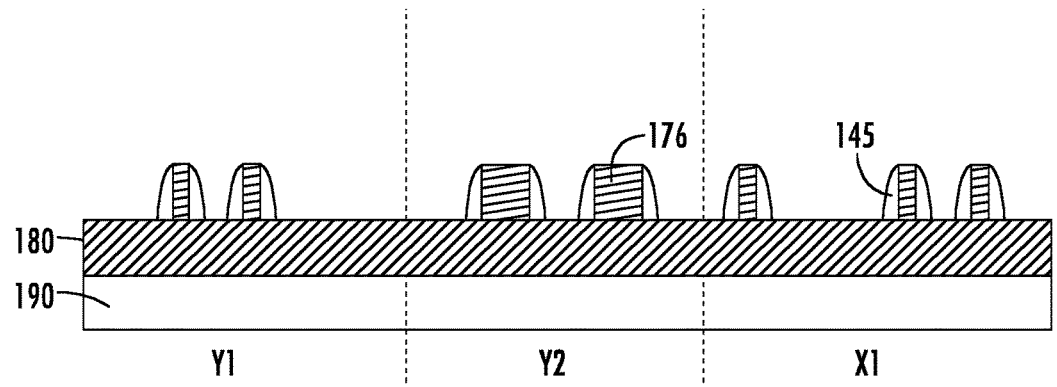
Figure 11C:
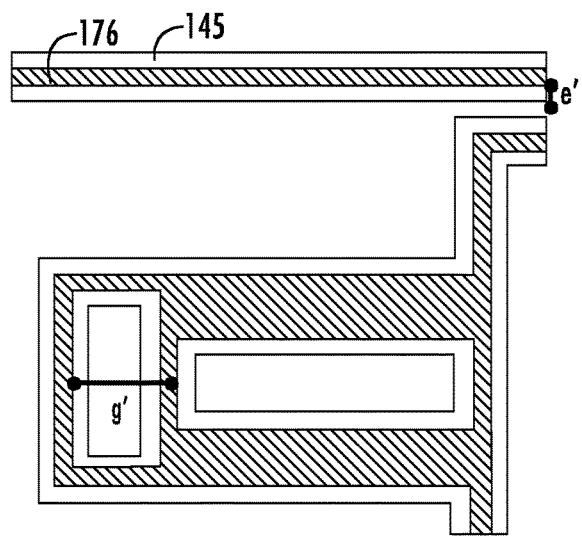
Figure 12A:
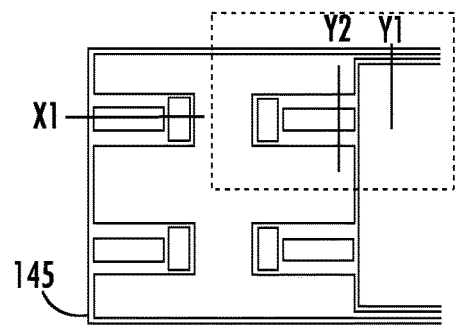
Figure 12B:
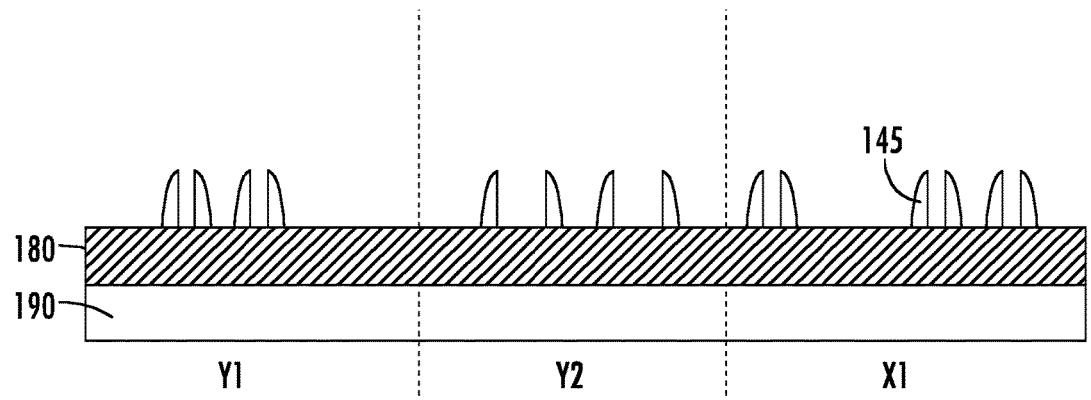
Figure 12C:
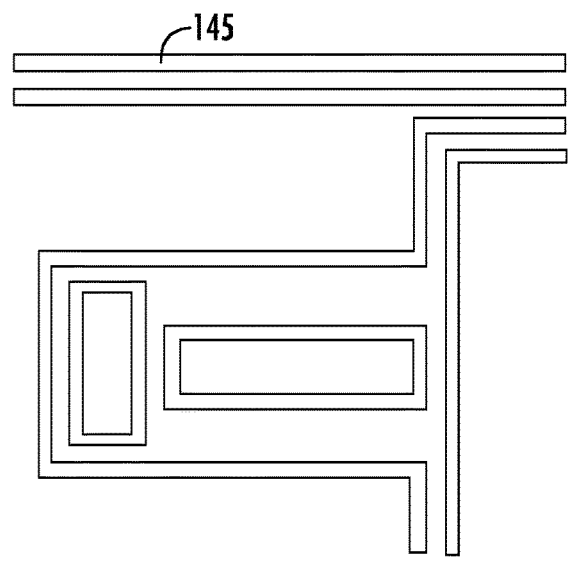

Continuing to step 210 shown in FIG. 3, a second set of spacers 145 is defined based on the trimmed second array 176. For example, spacer material such as an oxide, low temperature oxide (LTO), silicon, silicon nitride, and/or the like, may be deposited onto the chip blank. For example, a layer of spacer material may be deposited onto the exposed surface of the word line film stack 180 and the sidewalls and exposed surface of the trimmed second array 176. The spacer material may then be etched to remove the spacer material from the horizontal surfaces such that a second set of spacers (145) is formed on the word line film stack (180) and on sidewalls of the patterned second core 170 of the second array (175). FIGS. 11A, 11B, and 11C illustrate example top views and cross-sections of the chip blank after the spacer material has been deposited on the exposed word line film stack 180 and the trimmed second array 176 and etched to provide the spacers 145. A dry or wet strip may then be used to remove the remaining portion of the trimmed second array 176. FIGS. 12A, 12B, and 12C illustrate top views and cross-sections illustrating the second set of spacers 145 after the trimmed second array 176 has been stripped. In example embodiments, the width of one of the spacers 145, as shown by dimension e' may be 10-20 nm.

Figure 13A:
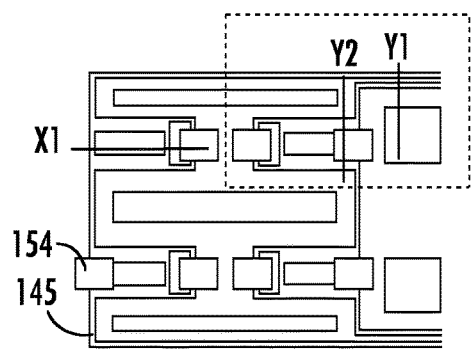
Figure 13B:
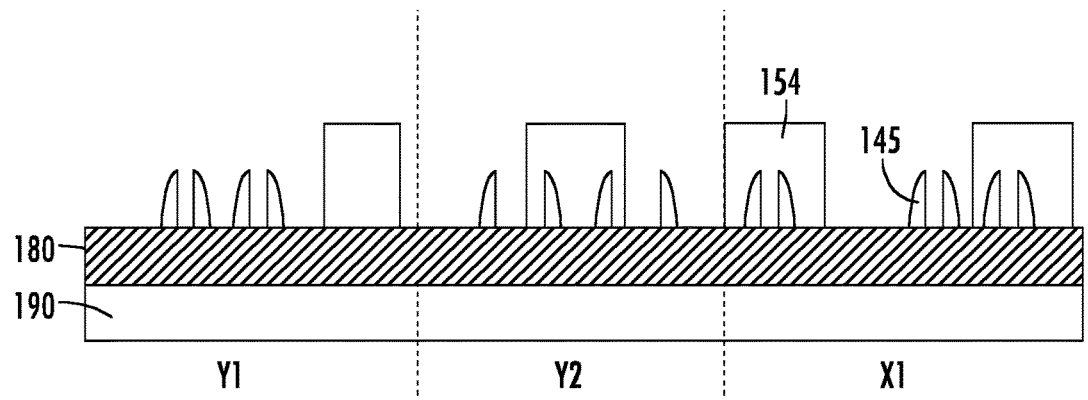
Figure 13C:
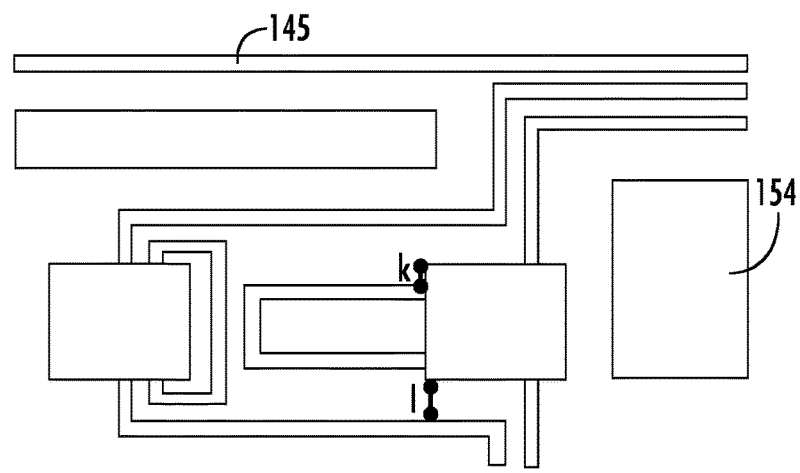

At step 212, as shown in FIG. 3, a second mask 154 is applied. The second mask may be configured to define the word line pads 10, the dummy blocks 40, SSL/GSL 50, and/or other features of the word line head region 100. For example, a layer of photoresist material may be formed on the exposed word line film stack 180 and/or second set of spacers 145 and prebaked to drive off excess photoresist solvent. The photoresist layer is then exposed to a pattern of bright light that will allow exposed areas of the photoresist layer to be removed and thereby forming the second mask 154. For example, photoresist mask may be deposited on the exposed word line film stack 180 and/or second set of spacers 145, as shown in FIGS. 13A, 13B, and 13C. In an example embodiment, the dimension k may be greater than 20 nm, the dimension l may be greater than 20 nm, and the dimension m may be greater than 10 nm.

Figure 14A:
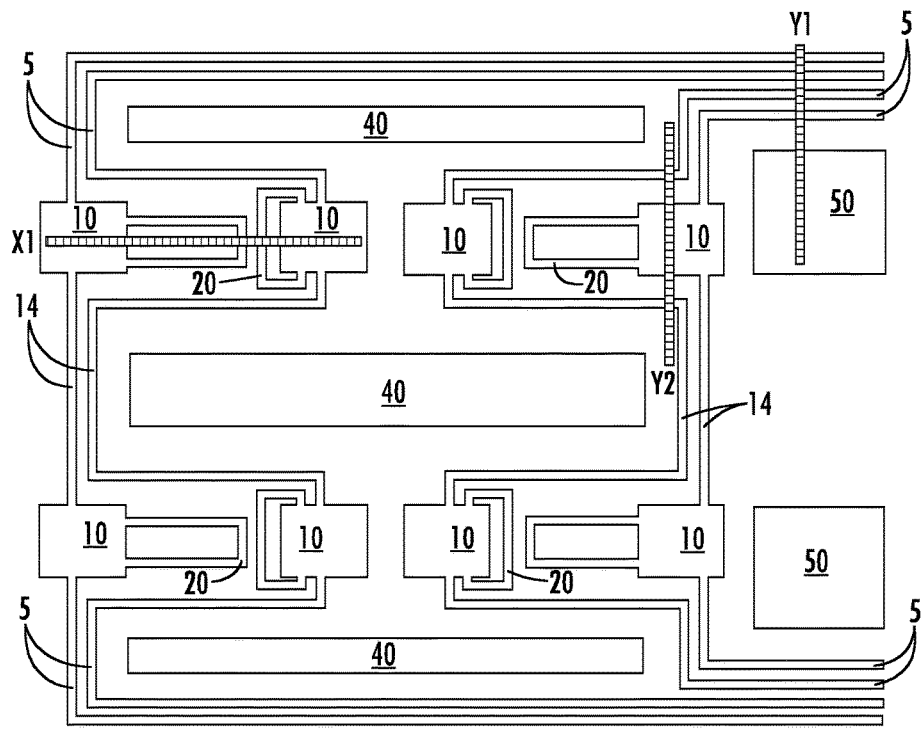
Figure 14B:
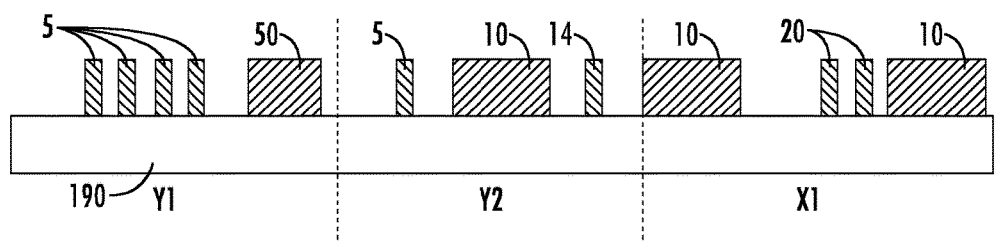

Continuing with FIG. 3, at step 214, the word line film stack 180 is etched to define the plurality of word lines 5, the plurality of word line pads 10, the plurality of dummy lines 14, the plurality of closed loops 20, one or more dummy blocks 40, one or more SSL/GSL 50, and/or the like. For example, a wet or dry etching process may be used to remove portions of the word line film stack 180 that are not protected by the second mask 154 and/or the second set of spacers 145. The second mask 154 is then removed. For example, the remaining portions of the photoresist layer may be stripped or ashed such that the second mask 154 is removed. The second set of spacers 145 may also be removed. For example, a hard mask removal process may be used to remove the second set of spacers 145. FIGS. 14A and 14B show a top view and various cross-sections of the word line head region 100 after the second mask 154 and the second set of spacers 145 have been removed. As shown in FIGS. 14A and 14B, the plurality of word lines (5), plurality of word line pads (10), plurality of dummy tails (15), and plurality of closed loops (20), are composed of a same layer of word line film stack (180) disposed on a substrate (190).

Figure 15:
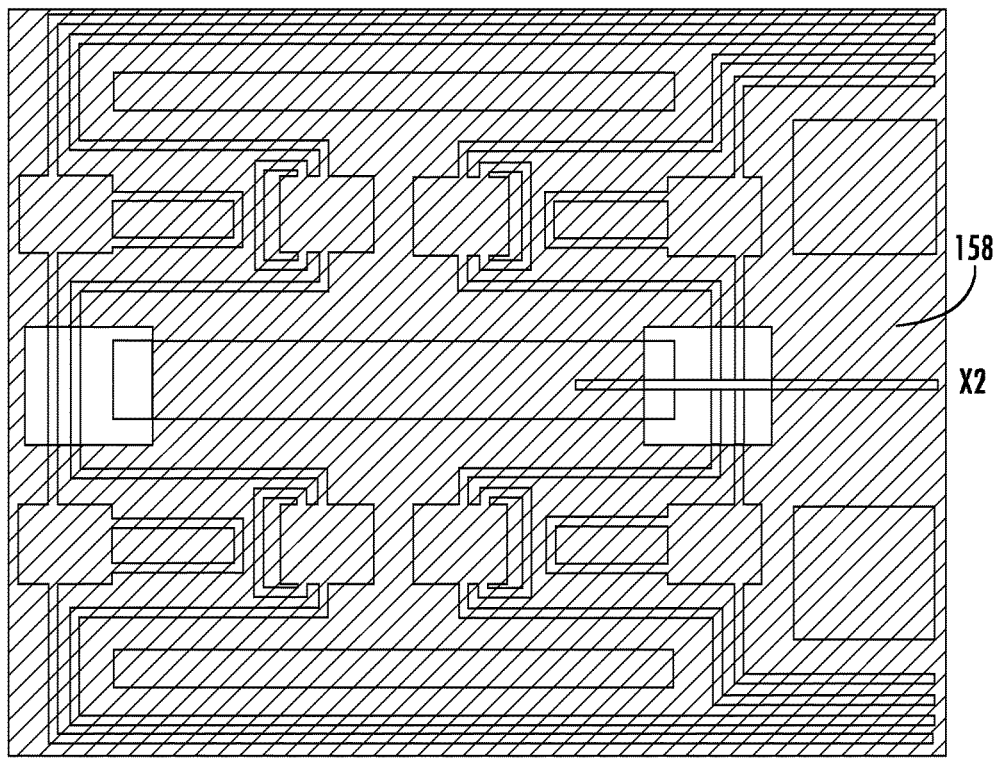
Figure 16:
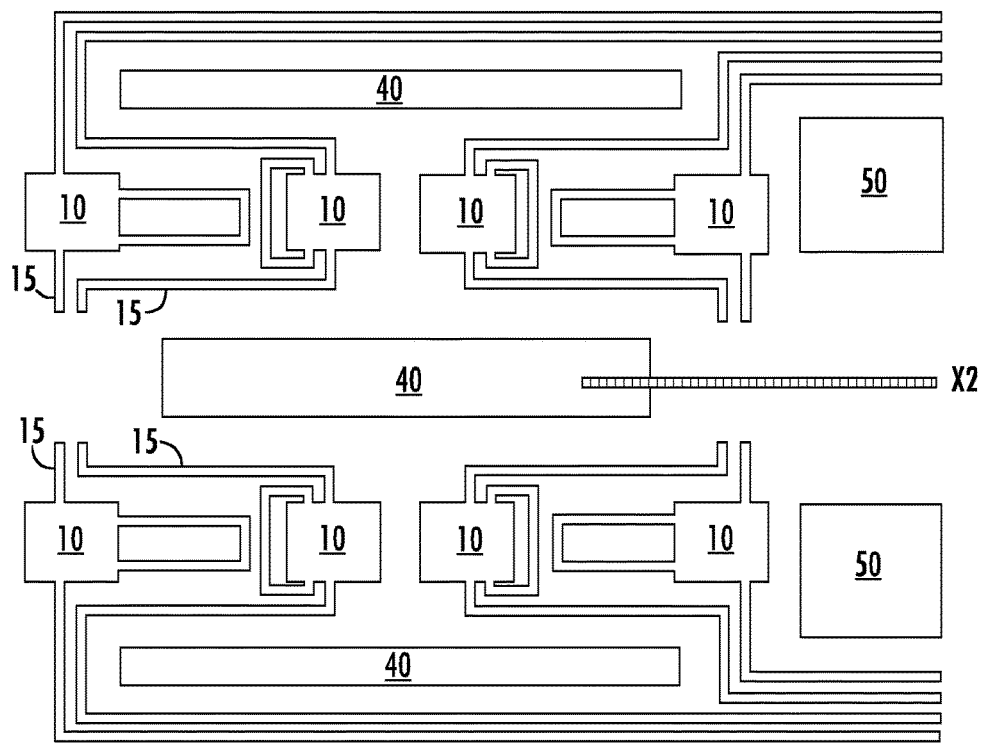

Returning to FIG. 3, at step 216, a third mask 158 is used to cut the dummy lines 14 into dummy tails 15. For example, a third mask 158 is applied to the plurality of word lines 5, plurality of word line pads 10, the plurality of closed loops 20, the SSL/GSL 50, at least a portion of the dummy blocks 40, a portion of the plurality of dummy lines 14, and/or the like. The third mask 158 may be configured to cut each dummy line 14 into two distinct dummy tails 15 that are not in direct electrical communication with one another. For example, a layer of photoresist material may be formed on the elements defined from the word line film stack 180 and the exposed substrate 190 and prebaked to drive off excess photoresist solvent. The photoresist layer is then exposed to a pattern of bright light that will allow exposed areas of the photoresist layer to be removed and thereby forming the third mask 158. For example, photoresist mask may be deposited on the elements defined from the word line film stack 180 and/or the exposed substrate, as shown in FIG. 15. The an etch may then be performed to cut each dummy line 14 into two dummy tails 15 that are not in direct electrical communication with each other. For example, a wet or dry etching process may then be used to remove portions of the word line film stack 180 that are not protected by the third mask 158. The third mask 158 is then removed. For example, the remaining portions of the photoresist layer may be stripped or ashed such that the third mask 158 is removed. FIG. 16 provides a top view of the word line head region 100 after the third mask 158 has been removed.

Figure 17A:
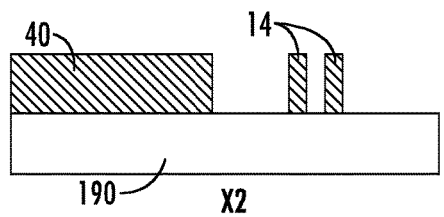
Figure 17B:
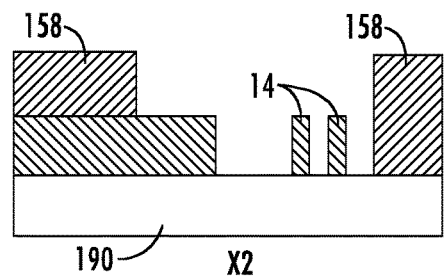
Figure 17C:
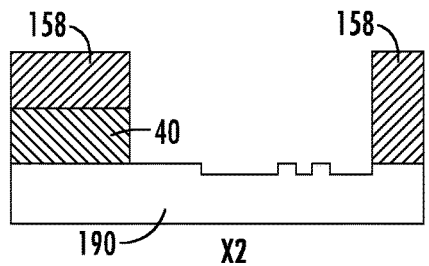
Figure 17D:
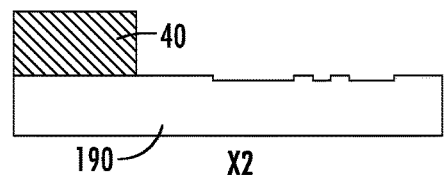

FIGS. 17A, 17B, 17C, and 17D show cross-sectional views at four different points in time over the course of applying the third mask 158, performing the etch to cut the dummy lines 14 into dummy tails, and removing the third mask 158. The cross-sectional views shown in FIGS. 17A, 17B, 17C, and 17D correspond to the X2 line shown in FIGS. 15 and 16. FIG. 17A shows a cross-sectional view at line X2 before the third mask 158 is applied. FIG. 17B shows a cross-sectional view at line X2 after the third mask 158 has been applied. FIG. 17C shows a cross-sectional view at line X2 after the etch has been performed and the dummy lines 14 have been cut. FIG. 17D shows a cross-sectional view at line X2 after the third mask 158 has been removed.

In various embodiments, a chemical-mechanical planarization (CMP) step may be completed at various points within the SMP self-aligned multiple patterning process. For example, after the removal of the second mask 154 and the second set of spacers 145 and before the application of the third mask 158, a CMP step may be inserted. In another example, a CMP step may be completed after the third mask 158 has been removed. It should be understood that various other processes may be completed in the course of, before, or after the described steps to further define elements of the word line head region 100, and/or to electrically and/or mechanically connect elements of the word line head region 100 to other parts of the non-volatile memory device.

As should be noted, the process of fabricating a word line head region 100 by the SMP SAQP process does not require a mask to enlarge the word line routing space such that there is sufficient space for the placement of the word line pads 10 (e.g., a poly line head (PLH) mask). It should further be noted that the dummy tails 15 and the closed loops 20 naturally arise as residues of the SMP SAQP process in which one or more self-merging profiles may be used to shape the word line head region 100. As previously described, the teachings of this method may be applied to various non-volatile memory fabrication applications wherein a self-aligned multiple patterning method is used to define an array (e.g., a word line array), a periphery (e.g., word line pads), and the connection between the array and the periphery.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A semiconductor device comprising:
a substrate;
a plurality of conductive lines;
a plurality of conductive pads;
a plurality of dummy tails; and
a plurality of closed loops;
wherein:
the plurality of conductive lines, the plurality of conductive pads, the plurality of dummy tails, and the plurality of closed loops are formed on the substrate, the plurality of conductive lines forming a conductive line array on the substrate,
each of the plurality of conductive pads is associated with one of the plurality of conductive lines, one of the plurality of dummy tails, and one of the plurality of closed loops,
each closed loop of the plurality of closed loops extends from and returns to an associated conductive pad of the plurality of conductive pads and is in direct electrical communication with the associated conductive pad,
each closed loop of the plurality of closed loops contacts the associated conductive pad at only two contact points, a first contact point of the two contact points being at an opposing side of the associated conductive pad relative to a second contact point of the two contact points,
each dummy tail of the plurality of dummy tails extends from the associated conductive pad and is in direct electrical communication with the associated conductive pad,
the plurality of conductive lines comprises a first conductive line and a second conductive line, the first conductive line being in direct electrical communication with a first conductive pad,
the first conductive line is parallel to the second conductive line for a first portion of a length of the first and second conductive lines, and the first conductive line is not parallel to the second conductive line for a second portion of the length of the first and second conductive lines, and
the second conductive line has more turns than the first conductive line.

2. The semiconductor device of claim 1, wherein the plurality of dummy tails and the plurality of closed loops are formed as residuals of a process used to create the plurality of conductive lines and the plurality of conductive pads.

3. The semiconductor device of claim 1 wherein the plurality of conductive lines, plurality of conductive pads, plurality of dummy tails, and plurality of closed loops, are composed of a same layer of film stack disposed on a substrate.

4. The semiconductor memory device of claim 3 wherein the film stack comprises of at least one of hard mask, a control gate layer, a floating gate layer, an inter-dielectric between the control gate layer and the floating gate layer, or a tunnel dielectric layer.

5. The semiconductor device of claim 1 further comprising a plurality of dummy blocks.

6. The semiconductor device of claim 1 wherein the semiconductor device is a non-volatile memory device, the plurality of conductive lines are a plurality of word lines, and the plurality of conductive pads are a plurality of word line pads.

* * * * *